(12) United States Patent
Adusumilli et al.

(10) Patent No.: US 11,322,357 B2
(45) Date of Patent: May 3, 2022

(54) BURIED DAMAGE LAYERS FOR ELECTRICAL ISOLATION

(71) Applicant: GLOBALFOUNDRIES U.S. Inc., Santa Clara, CA (US)

(72) Inventors: Siva P. Adusumilli, South Burlington, VT (US); Anthony K. Stamper, Williston, VT (US); Michel J. Abou-Khalil, Essex Junction, VT (US); John J. Ellis-Monaghan, Grand Isle, VT (US); Bojidha Babu, South Burlington, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 122 days.

(21) Appl. No.: 16/806,383

(22) Filed: Mar. 2, 2020

(65) Prior Publication Data

US 2021/0272812 A1    Sep. 2, 2021

(51) Int. Cl.
    *H01L 21/265*    (2006.01)
    *H01L 21/762*    (2006.01)
    *H01L 21/324*    (2006.01)
    *H01L 29/04*    (2006.01)

(52) U.S. Cl.
    CPC ...... *H01L 21/26533* (2013.01); *H01L 21/324* (2013.01); *H01L 21/76224* (2013.01); *H01L 29/04* (2013.01)

(58) Field of Classification Search
    None
    See application file for complete search history.

(56) References Cited

U.S. PATENT DOCUMENTS

| 4,786,608 | A  | 11/1988 | Griffith |
| 5,012,305 | A  | 4/1991  | Khadder et al. |
| 5,723,896 | A  | 3/1998  | Abraham et al. |
| 6,833,322 | B2 | 12/2004 | Anderson et al. |
| 8,299,537 | B2 | 10/2012 | Greco et al. |
| 8,324,031 | B2 | 12/2012 | Tan et al. |

(Continued)

OTHER PUBLICATIONS

Steven M. Shank et al., "Multi-Depth Regions of High Resistivity in a Semiconductor Substrate", filed Oct. 10, 2019 as U.S. Appl. No. 16/598,064.

(Continued)

*Primary Examiner* — Bradley Smith
(74) *Attorney, Agent, or Firm* — Thompson Hine LLP; Francois Pagette

(57) ABSTRACT

Structures including electrical isolation and methods of forming a structure including electrical isolation. A first polycrystalline layer is located in a substrate, and a second polycrystalline layer is positioned between the first polycrystalline layer and a top surface of the substrate. The substrate includes a first portion of the single-crystal semiconductor material that is positioned between the second polycrystalline layer and the top surface of the substrate. The substrate includes a second portion of the single-crystal semiconductor material that is positioned between the first polycrystalline layer and the second polycrystalline layer. The first polycrystalline layer has a thickness. The second polycrystalline layer has a portion with a thickness that is greater than the thickness of the first polycrystalline layer.

20 Claims, 3 Drawing Sheets

(56) References Cited

U.S. PATENT DOCUMENTS

| | | | |
|---|---|---|---|
| 9,263,587 B1* | 2/2016 | Jacob | H01L 29/161 |
| 10,192,779 B1* | 1/2019 | Shank | H01L 21/324 |
| 10,651,281 B1* | 5/2020 | Adusumilli | H01L 29/04 |
| 2018/0323066 A1 | 11/2018 | Abou-Khalil et al. | |
| 2019/0295881 A1 | 9/2019 | Shank et al. | |

OTHER PUBLICATIONS

Taiwan Intellectual Property Office, Examination Report dated Feb. 7, 2022 in Taiwanese Patent Application No. 110103834; 8 pages.

* cited by examiner

BURIED DAMAGE LAYERS FOR ELECTRICAL ISOLATION

BACKGROUND

The present invention relates to semiconductor device fabrication and integrated circuits and, more specifically, to structures including electrical isolation and methods of forming a structure including electrical isolation.

Device structures, such as radiofrequency switches, are susceptible to high capacitance and body-to-body leakage when formed using a bulk semiconductor wafer. A measure that may be taken to reduce the susceptibility is to replace the bulk wafer with a silicon-on-insulator wafer in which a buried insulator layer is arranged between the body furnishing an active device region of the device structure and the body of the substrate beneath the buried insulator layer. Another measure that may be taken to reduce the susceptibility is to provide triple well isolation that surrounds the active device region of the device structure.

Although such measures have proven suitable for their intended purpose, structures with improved electrical isolation and methods of forming a structure including electrical isolation are needed.

SUMMARY

In an embodiment of the invention, a structure includes a substrate composed of a single-crystal semiconductor material, a first polycrystalline layer in the substrate, and a second polycrystalline layer positioned between the first polycrystalline layer and a top surface of the substrate. The substrate includes a first portion of the single-crystal semiconductor material that is positioned between the second polycrystalline layer and the top surface of the substrate. The substrate includes a second portion of the single-crystal semiconductor material that is positioned between the first polycrystalline layer and the second polycrystalline layer. The first polycrystalline layer has a thickness. The second polycrystalline layer has a portion with a thickness that is greater than the thickness of the first polycrystalline layer.

In an embodiment of the invention, a method includes performing a first plurality of ion implantation processes to form a first plurality of segments in a substrate and performing a second plurality of ion implantation processes to form a second plurality of segments in the substrate. Each of the first plurality of segments contains first implanted ions, and the first plurality of ion implantation processes are performed at a first plurality of different energies. Each of the second plurality of segments contains second implanted ions, and the second plurality of ion implantation processes are performed at a second plurality of different energies. The method further includes annealing the substrate to transform the substrate proximate to the first plurality of segments and the second plurality of segments into a first polycrystalline layer and a second polycrystalline layer that is positioned between the first polycrystalline layer and top surface of the substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
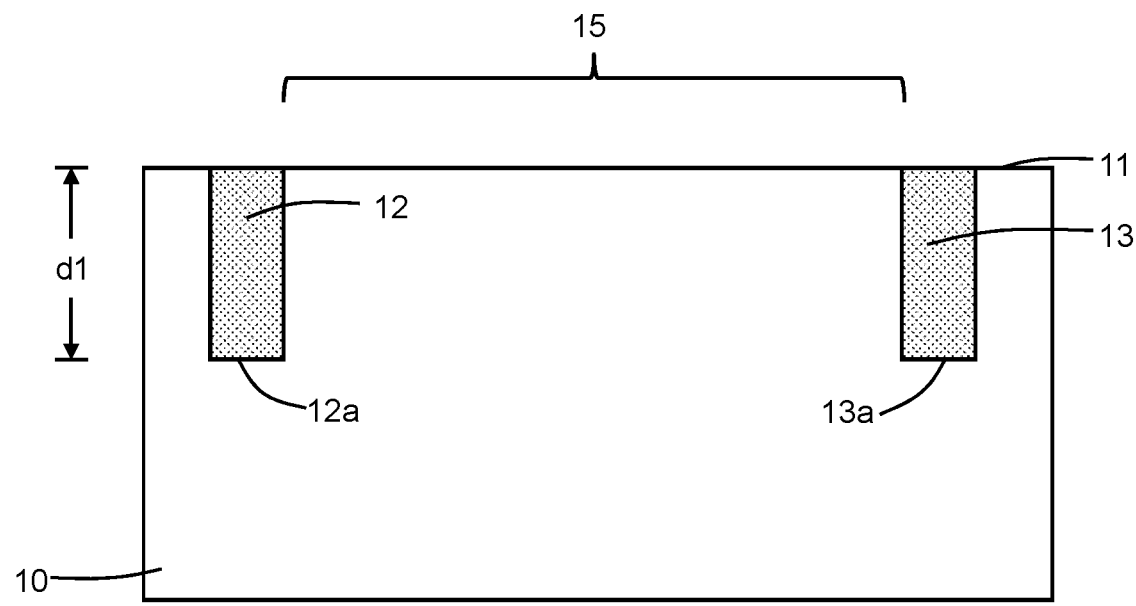
FIGS. 1-4 are cross-sectional views of a structure at successive fabrication stages of a processing method in accordance with embodiments of the invention.

With reference to FIG. 1 and in accordance with embodiments of the invention, a semiconductor substrate 10 is provided that is composed of a single-crystal semiconductor material, such as single-crystal silicon. The semiconductor substrate 10 may be a bulk wafer composed of single-crystal semiconductor material (e.g., single-crystal silicon), and the bulk wafer may be a high-resistivity bulk wafer.

Shallow trench isolation regions 12, 13 may be formed in the semiconductor substrate 10 by etching trenches, depositing a dielectric material, such as silicon dioxide, in the trenches, and planarizing with chemical-mechanical polishing. The shallow trench isolation regions 12, 13 surround a portion of the semiconductor substrate 10 to define an active device region 15 for device formation. The shallow trench isolation regions 12, 13 may extend to a depth, d1, into the semiconductor substrate 10 relative to a top surface of the semiconductor substrate 10. The shallow trench isolation regions 12, 13 have respective terminating surfaces 12a, 13a located at the depth, d1.

Figure 2:
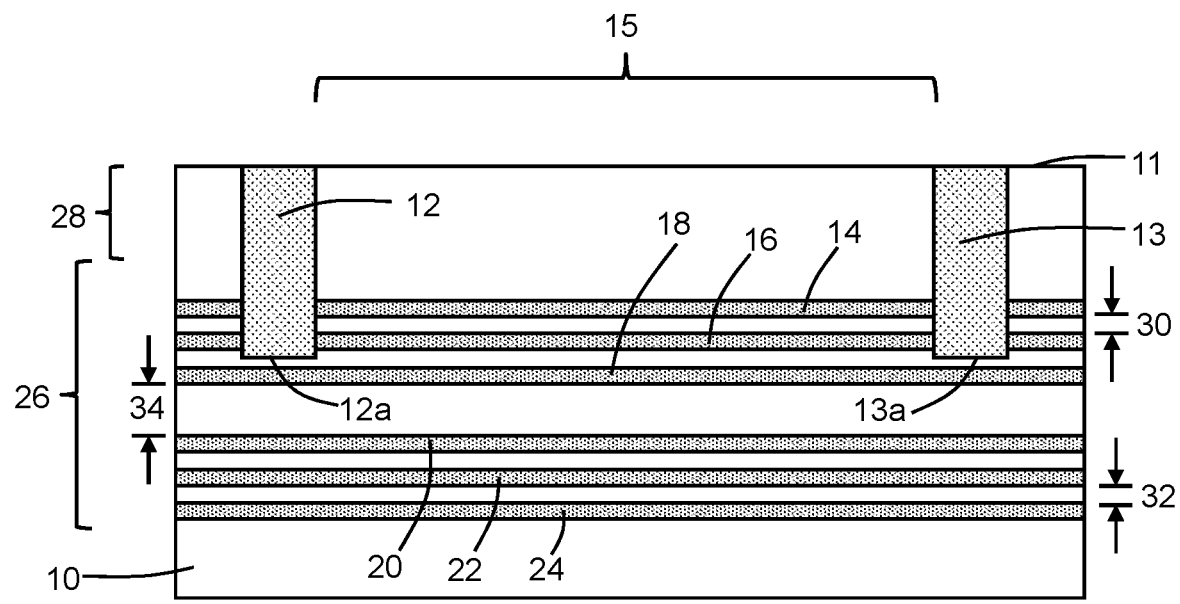

With reference to FIG. 2 in which like reference numerals refer to like features in FIG. 1 and at a subsequent fabrication stage of the processing method, a series of ion implantations is performed to produce respective segments or bands 14, 16, 18 of implanted ions in the semiconductor substrate 10. Each of the bands 14, 16, 18 of implanted ions is provided by an ion implantation process performed with given implantation conditions (e.g., ion species, dose, kinetic energy). A separate series of ion implantations is performed to also produce respective segments or bands 20, 22, 24 of implanted ions in the semiconductor substrate 10. Each of the bands 20, 22, 24 of implanted ions is provided by an ion implantation process performed with given implantation conditions (e.g., ion species, dose, kinetic energy).

Each ion implantation process introduces energetic ions, as indicated diagrammatically by the single-headed arrows, with ion trajectories that travel in paths through the semiconductor substrate 10 and the shallow trench isolation regions 12 surrounding the active device region. The energetic ions lose energy along their paths via stochastic scattering events with atomic nuclei and electrons in the traversed material. Energy lost in nuclear collisions, which dominates at low energies, displaces target atoms of the semiconductor substrate 10 from their original lattice sites, which damages the crystal lattice structure of the semiconductor substrate 10 and generates point defects. The ions of each ion implantation process eventually stop in one of the bands 14, 16, 18 or in one of the bands 20, 22, 24 after their kinetic energy is fully dissipated by energy loss. The crystal lattice structure of the semiconductor substrate 10 may be damaged over a modified region 26, compared to the initial single-crystal state, by the cumulative damage to the crystal structure induced by the implanted ions of each implantation process. Beyond the depth of the modified region 26, the crystal lattice structure of the semiconductor substrate 10 is undamaged. The crystal lattice structure of a region 28 of the semiconductor substrate 10 between the modified region 26 and the top surface 11 of the semiconductor substrate 10 may also be undamaged. As a result, the modified region 26 containing damaged semiconductor material may be positioned between single-crystal semiconductor material of the overlying region 28 of the semiconductor substrate 10 and single-crystal semiconductor material of the underlying bulk of the semiconductor substrate 10.

The bands 14, 16, 18 of implanted ions and the bands 20, 22, 24 of implanted ions are located in the modified region 26. The bands 20, 22, 24 of implanted ions are located at a depth in the semiconductor substrate 10 that is deeper than the shallow trench isolation regions 12, 13 and, more specifically, the terminating surfaces 12a, 13a of the shallow trench isolation regions 12, 13 are located between the bands 20, 22, 24 of implanted ions and the top surface 11 of the semiconductor substrate 10. The distribution of implanted atoms in each of the bands 14, 16, 18 and the distribution of implanted atoms in each of the bands 20, 22, 24 may be approximated by a Gaussian shape centered about a projected range or, alternatively, may be approximated by a moments distribution characterized by a projected range, straggle, skewness, and kurtosis. The peak concentration in the distribution of implanted atoms occurs at the projected range.

The ions may be generated from a suitable source gas and implanted into the semiconductor substrate 10 using an ion implantation tool. The ions may be generated from argon, or from another type of noble atom gas or inert gas, such as xenon. Alternatively, the ions may be generated from a different source gas, such as a germanium-containing source gas (e.g., germane). The total ion dose for all ion implantation processes is selected to be less than a threshold dose beyond which recrystallization of the damaged semiconductor material in the modified region 26 by a subsequent anneal is not possible. In an embodiment, the ion dose of each ion implantation process may be within a range of $1 \times 10^{13}$ ions/cm$^2$ to $1 \times 10^{16}$ ions/cm$^2$.

Performing multiple implantations may permit the total dose forming the bands 14, 16, 18 to be greater than the dose of a single implantation while maintaining the ability to recrystallize the damaged semiconductor material. Similarly, performing multiple implantations may permit the total dose forming the bands 20, 22, 24 to be greater than the dose of a single implantation while maintaining the ability to recrystallize the damaged semiconductor material.

The bands 14, 16, 18, which are formed by individual ion implantation processes performed under different implantation conditions, may be distributed in depth with a separation between adjacent bands 14, 16, 18 given by a distance or spacing 30. The spacing 30 may be measured in units of distance (e.g., nanometers) between the projected ranges associated with the different bands 14, 16, 18. In an embodiment, the spacing 30 between the band 14 and the band 16 may be equal or substantially equal to the spacing 30 between the band 16 and the band 18. The spacing 30 may be established by implanting ions of the same species with a set of kinetic energies that differ by a given energy increment, $\Delta 1$. More specifically, the implantation process forming the band 16 may be performed at a given kinetic energy (E1), the implantation process forming the band 14 may be performed at a lower kinetic energy (E1−$\Delta 1$), and the implantation process forming the band 18 may be performed at a higher kinetic energy (E1+$\Delta 1$). In an embodiment, the energy increment may be greater than or equal to 20 kiloelectron volts (keV). As a numerical example, the band 14 may be formed by implanting argon ions at a kinetic energy of 360 keV, the band 16 may be formed by implanting argon ions at a kinetic energy of 400 keV, and the band 18 may be formed by implanting argon ions at a kinetic energy of 440 keV.

The bands 14, 16, 18 may all be formed using the same ion species, such as argon. Heavier inert gas ions, such as xenon ions, may be implanted to form all of the bands 14, 16, 18. In an alternative embodiment, the ion implantations forming bands 14, 16, 18 may be performed using different ion species. For example, the band 14 may be formed by implanting germanium ions, and the band 16 may be formed by implanting argon ions. Other combinations of ion species may be implanted to form the different bands 14, 16, 18.

The bands 20, 22, 24, which are formed by individual ion implantation processes performed under different implantation conditions, may be distributed in depth with a separation between adjacent bands 20, 22, 24 given by a distance or spacing 32. The spacing 32 may be measured in units of distance (e.g., nanometers) between the projected ranges associated with the different bands 20, 22, 24. In an embodiment, the spacing 32 between the band 20 and the band 22 may be equal or substantially equal to the spacing 32 between the band 22 and the band 24. The spacing 30 may be established by implanting ions of the same species with a set of kinetic energies that differ by a given energy increment, $\Delta 2$. More specifically, the implantation process forming the band 22 may be performed at a given kinetic energy (E2), the implantation process forming the band 20 may be performed at a lower kinetic energy (E2−$\Delta 2$), and the implantation process forming the band 24 may be performed at a higher kinetic energy (E2+$\Delta 2$). In an embodiment, the energy increment, $\Delta 2$, may be greater than or equal to 20 kiloelectron volts (keV). As a numerical example, the band 20 may be formed by implanting argon ions at a kinetic energy of 600 keV, the band 22 may be formed by implanting argon ions at a kinetic energy of 640 keV, and the band 24 may be formed by implanting argon ions at a kinetic energy of 680 keV.

The bands 20, 22, 24 may all be formed using the same ion species, such as argon. Heavier inert gas ions, such as xenon ions, may be implanted to form all of the bands 20, 22, 24. In an alternative embodiment, the ion implantations forming bands 20, 22, 24 may be performed using different ion species. For example, the band 20 may be formed by implanting germanium ions, and the band 22 may be formed by implanting argon ions. Other combinations of ion species may be implanted to form the different bands 20, 22, 24.

The bands 20, 22, 24 are positioned in a grouping in the semiconductor substrate 10 and the bands 14, 16, 18 are positioned in another grouping at a shallower depth in the semiconductor substrate 10. The grouping of bands 20, 22, 24 is spaced from the grouping of bands 14, 16, 18 by a distance or spacing 34. More specifically, the spacing 34 may be measured between the deepest band 18 of the grouping including the bands 14, 16, 18 and the shallowest band 20 of the grouping including the bands 20, 22, 24. The spacing 34 may be greater than either the spacing 30 or the spacing 32. The spacing 34 may be established by implanting ions of the same species for the band 18 and the band 20 with kinetic energies that differ by a given energy increment, $\Delta 3$. In embodiment, the energy increment, $\Delta 3$, may be greater than or equal to 100 kiloelectron volts (keV).

In alternative embodiments, the number of groupings may be greater than the number of groupings in the representative embodiment. For example, three or more groupings of bands may be formed in the semiconductor substrate 10. In an alternative embodiment, the bands may be included in a single grouping having a uniform spacing between bands.

Figure 3:
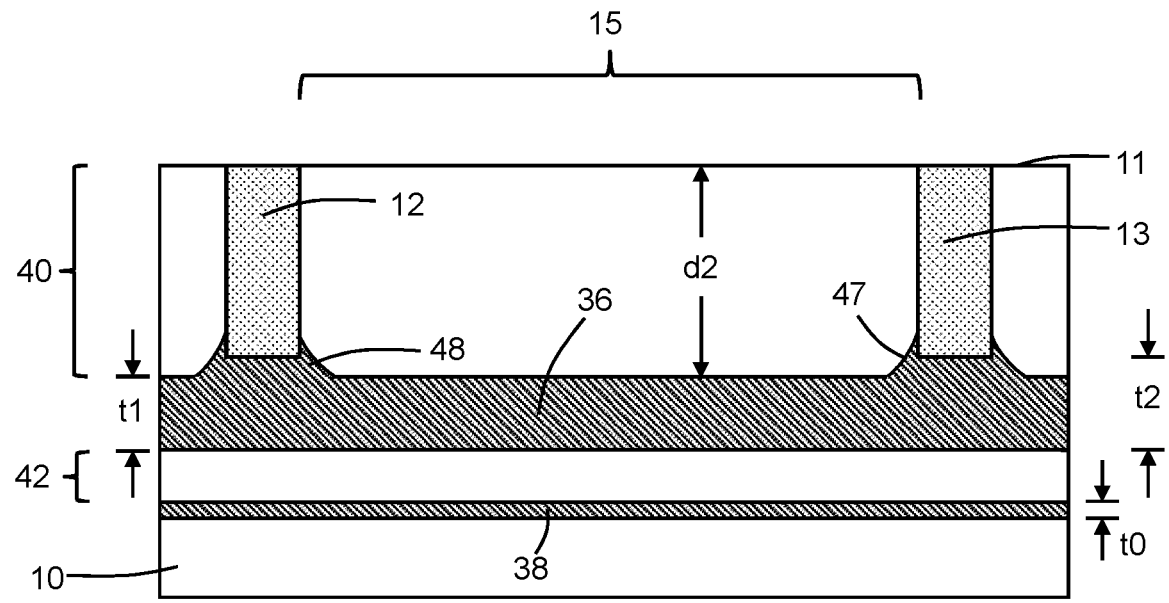

With reference to FIG. 3 in which like reference numerals refer to like features in FIG. 2 and at a subsequent fabrication stage of the processing method, the semiconductor substrate 10 is subjected to a thermal treatment (i.e., annealing process). In an embodiment, the thermal treatment may be a spike anneal. In an embodiment, the spike anneal may be a rapid thermal anneal (RTA) performed using, for example, a bank of flash lamps that heat the semiconductor substrate 10 to a peak temperature in a range of 850° C. to 1125° C. with a dwell time at the peak temperature of 30 milliseconds to 60 seconds.

The thermal treatment recrystallizes a portion of the damaged semiconductor material of the modified region 26 into a polycrystalline layer 36 that contains polycrystalline semiconductor material (e.g., polysilicon) and defects as residual damage in addition to the grains of the polycrystalline semiconductor material. The thermal treatment recrystallizes another portion of the damaged semiconductor material of the modified region 26 into a polycrystalline layer 38 that contains polycrystalline semiconductor material (e.g., polysilicon) and defects as residual damage in addition to the grains of the polycrystalline semiconductor material. The defects may contain trapped atoms of the noble gas or inert gas species (e.g., argon) implanted to form the bands 14, 16, 18, 20, 22, 24 and modified region 26. The single-crystal semiconductor material of the semiconductor substrate 10, which is arranged above and below the modified region 26 (FIG. 1) before the thermal treatment, has a crystal-lattice structure that provides a crystalline template for recrystallization during the thermal treatment.

The polycrystalline layers 36, 38 may have an electrical resistance that is greater than the electrical resistance of the remainder of the semiconductor substrate 10. The polycrystalline layers 36, 38 may be characterized as a trap-rich material and, in an embodiment, each may have an electrical resistivity that is greater than 100 ohm-cm. In an alternative embodiment, one or both of the polycrystalline layers 36, 38 may have an electrical resistivity that is greater than 1000 ohm-cm. The polycrystalline layer 36 may contain oxygen that is ballistically transferred by the ions from an oxide screen layer that may be applied to the top surface 11 of the semiconductor substrate 10 prior to the implantations.

The thermal treatment also recrystallizes the damaged semiconductor material of the semiconductor substrate 10 within the modified region 26, with the exception of the polycrystalline layers 36, 38, back into respective portions 40, 42 of single-crystal semiconductor material (e.g., single-crystal silicon). The portion 40 of single-crystal semiconductor material is located in a vertical direction between the polycrystalline layer 36 and the top surface 11 of the semiconductor substrate 10, and the portion 42 of single-crystal semiconductor material is located in the vertical direction between the polycrystalline layer 36 and the polycrystalline layer 38. The recrystallized semiconductor material of portions 40, 42 lacks grains and defects in contrast to the polycrystalline layers 36, 38.

The polycrystalline layer 38 is continuous in that the grains and defects are continuous and unbroken. The polycrystalline layer 38 extends laterally in the semiconductor substrate 10 beneath the shallow trench isolation regions 12, 13 and beneath the active device region 15. The polycrystalline layer 38 has a thickness, t0, that may be constant or substantially constant and that may be independent of lateral position. For example, the polycrystalline layer 38 may have a thickness, t0, in a range of 10 nanometers to 20 nanometers.

The polycrystalline layer 36 is likewise continuous and unbroken. The polycrystalline layer includes a portion that extends laterally in the semiconductor substrate 10 between the shallow trench isolation regions 12, 13 and beneath the active device region 15, and portions beneath each of the shallow trench isolation regions 12, 13. The polycrystalline layer 36 has a thickness that may vary with position relative to the shallow trench isolation regions 12, 13 and active device region 15. The portion of the polycrystalline layer 36 beneath the active device region 15 has a thickness, t1, and the portion of the polycrystalline layer 36 beneath the shallow trench isolation regions 12, 13 has a thickness, t2, that is greater than the thickness, t1. For example, the thickness, t1, of the portion of the polycrystalline layer 36 beneath the shallow trench isolation regions 12, 13 may be equal to approximately twice the thickness, t2, of the portion of the polycrystalline layer 36 beneath the active device region 15. The portion of the polycrystalline layer 36 beneath the active device region 15 and the portion of the polycrystalline layer 36 beneath the shallow trench isolation regions 12, 13 are both thicker than the polycrystalline layer 38. In embodiments, the thickness, t1, of the polycrystalline layer 36 beneath the shallow trench isolation regions 12, 13 may range from 300 nanometers to 500 nanometers, and the thickness, t2, of the polycrystalline layer 36 beneath the active device region 15 may range from 150 nanometers to 250 nanometers. The polycrystalline layer 36 may be self-planarized relative to the shallow trench isolation regions 12, 13.

The portion of the polycrystalline layer 36 beneath the active device region 15 may be located at a greater depth, d2, in the semiconductor substrate 10 than the shallow trench isolation regions 12, 13 and, more specifically, may be located at a greater depth in the semiconductor substrate 10 than the depth of the terminating surfaces 12a, 13a (FIG. 1) of the shallow trench isolation regions 12, 13. The portion of the polycrystalline layer 36 beneath the active device region 15 converges with the portion of the polycrystalline layer 36 overlapping with the shallow trench isolation regions 12, 13 at the respective interfaces between the shallow trench isolation regions 12, 13 and active device region 15. The polycrystalline layer 36 includes transition regions 48 beneath the active device region 15 and that extend above the terminating surfaces 12a, 13a of the shallow trench isolation regions 12, 13. Each of the transition regions 48 of the polycrystalline layer 36 includes a curved surface 47 that is non-planar and that faces inward toward the active device region 15.

In alternative embodiments, the portion of the polycrystalline layer 36 beneath the active device region 15 may be located at a shallower depth in the semiconductor substrate 10 than the shallow trench isolation regions 12, 13 and, more specifically, may be located at a depth in the semiconductor substrate 10 that is less than the depth of the terminating surfaces 12a, 13a (FIG. 1) of the shallow trench isolation regions 12, 13. The kinetic energies of the implanted ions used to form at least the bands 14, 16, 18 may be lowered in order to decrease the depth of the portion of the polycrystalline layer 36 beneath the active device region 15.

Figure 4:
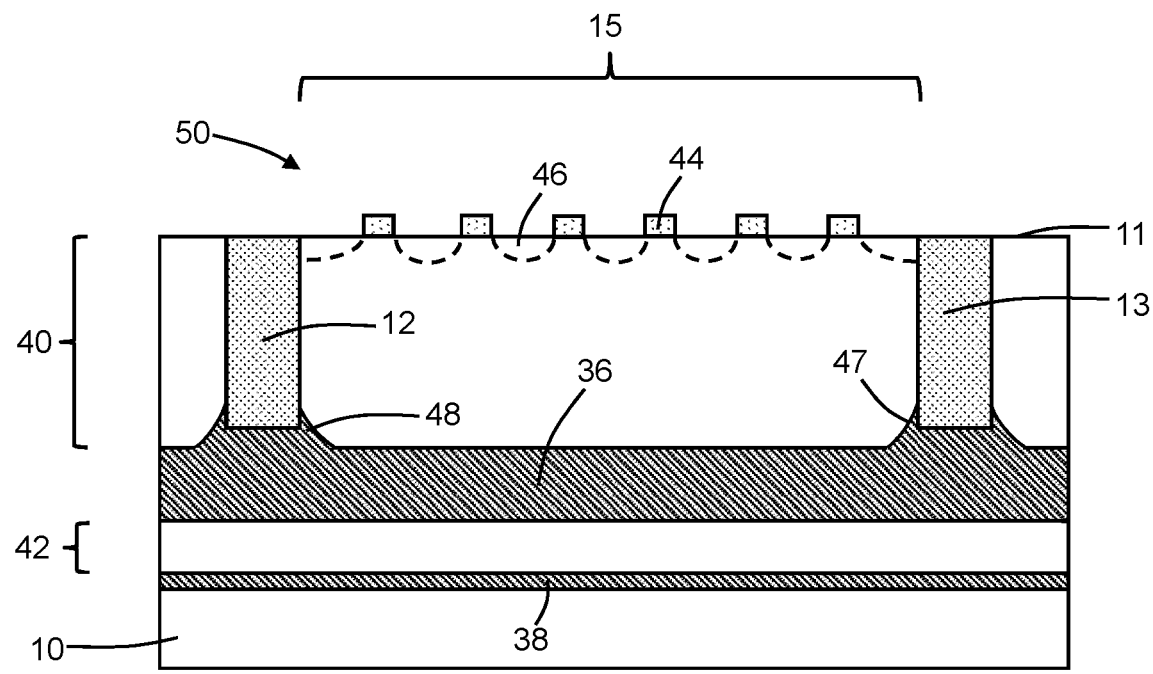

With reference to FIG. 4 in which like reference numerals refer to like features in FIG. 3 and at a subsequent fabrication stage of the processing method, a switch field-effect transistor 50 may be fabricated by front-end-of-line processing as a device structure in the active device region 15 of the semiconductor substrate 10. The switch field-effect transistor 50 may include gate fingers 44 of a gate electrode that is formed on the semiconductor substrate 10 and source/drain regions 46 that are formed in the semiconductor substrate 10. The gate fingers 44 may be formed, for example, by patterning a deposited layer of heavily-doped polysilicon, and the source/drain regions 46 may be formed by ion implantation of either a p-type or n-type dopant. The switch field-effect transistor 50 may include other elements such as a gate dielectric between the gate fingers 44 and the top surface 11 of the semiconductor substrate 10, halo regions and lightly-doped drain extensions in the semiconductor substrate 10, and sidewall spacers on the gate fingers 44. In an embodiment, the switch field-effect transistor 50 may be deployed in a radio-frequency circuit.

Middle-of-line processing and back-end-of-line processing follow, which includes formation of contacts, vias, and wiring for an interconnect structure that is coupled with the switch field-effect transistor 50.

The polycrystalline layers 36, 38, which exhibit a high electrical resistance, may improve the linearity of the switch field-effect transistor 50 during operation. The switch field-effect transistor 50 is formed in a portion of the semiconductor substrate 10 in the active device region 15, instead of being formed in a doped well of a conventional triple-well arrangement. Due to the absence of wells, the semiconductor material of the semiconductor substrate 10 above the polycrystalline layer 36 has a high electrical resistance.

Figure 5:
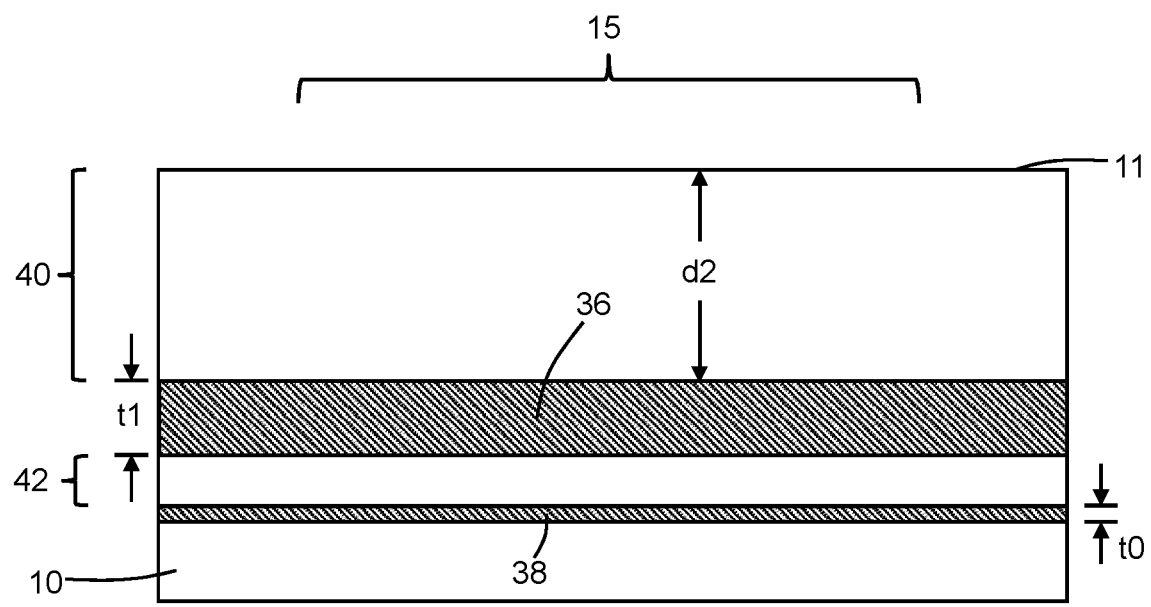
FIG. 5 is a cross-sectional view of a structure in accordance with alternative embodiments of the invention.

With reference to FIG. 5 in which like reference numerals refer to like features in FIG. 3 and in accordance with alternative embodiments of the invention, the polycrystalline layers 36, 38 may be formed in a region of the semiconductor substrate 10 that lacks the shallow trench isolation regions 12, 13. The absence of trench isolation regions may, to some extent, modify the properties of the polycrystalline layers 36, 38. For example, the transition regions 48 will be absent.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a substrate comprised of a single-crystal semiconductor material, the substrate having a top surface;
   a first polycrystalline layer in the substrate; and
   a second polycrystalline layer positioned between the first polycrystalline layer and the top surface of the substrate,
   wherein the substrate includes a first portion of the single-crystal semiconductor material that is positioned between the second polycrystalline layer and the top surface of the substrate, the substrate includes a second portion of the single-crystal semiconductor material that is positioned between the first polycrystalline layer and the second polycrystalline layer, the first polycrystalline layer has a thickness, and the second polycrystalline layer has a first portion with a first thickness that is greater than the thickness of the first polycrystalline layer.

2. The structure of claim 1 further comprising:
   a first shallow trench isolation region extending from the top surface into the substrate; and
   a second shallow trench isolation region extending from the top surface into the substrate,
   wherein the first shallow trench isolation region and the second shallow trench isolation region define an active device region of the substrate, and the first polycrystalline layer and the second polycrystalline layer each extend laterally beneath the active device region, the first shallow trench isolation region, and the second shallow trench isolation region.

3. The structure of claim 2 wherein the first portion of the second polycrystalline layer is located beneath the active device region, the second polycrystalline layer includes a second portion beneath the first shallow trench isolation region and a third portion beneath the second shallow trench isolation region, the first portion of the second polycrystalline layer is located at a greater depth in the substrate than the first shallow trench isolation region, the second portion of the second polycrystalline layer is in direct contact with the first shallow trench isolation region, and the third portion of the second polycrystalline layer is in direct contact with the second shallow trench isolation region.

4. The structure of claim 2 further comprising:
a switch field-effect transistor in the active device region.

5. The structure of claim 2 wherein the first portion of the second polycrystalline layer includes a polycrystalline structure that is continuous beneath the active device region.

6. The structure of claim 1 wherein the first portion of the single-crystal semiconductor material fully separates the second polycrystalline layer from the top surface of the substrate.

7. The structure of claim 6 wherein the second portion of the single-crystal semiconductor material fully separates the first polycrystalline layer from the second polycrystalline layer.

8. The structure of claim 1 further comprising:
a shallow trench isolation region extending from the top surface into the substrate,
wherein the second polycrystalline layer includes a second portion in direct contact with the shallow trench isolation region, and the first portion of the second polycrystalline layer is located at a greater depth relative to the top surface of the substrate than the shallow trench isolation region.

9. The structure of claim 8 wherein the first portion of the single-crystal semiconductor material fully separates the first portion of the second polycrystalline layer from the top surface of the substrate.

10. The structure of claim 8 wherein the second polycrystalline layer includes a third portion laterally between the first portion and the second portion of the second polycrystalline layer and adjacent to the shallow trench isolation region, and the third portion of the second polycrystalline layer has a curved interface with the first portion of the single-crystal semiconductor material.

11. The structure of claim 8 wherein the second portion of the second polycrystalline layer has a second thickness that is greater than the first thickness of the first portion of the second polycrystalline layer.

12. The structure of claim 1 wherein the first thickness of the first portion of the second polycrystalline layer is within a range of 300 nanometers to 500 nanometers, and the thickness of the first polycrystalline layer is within a range of 10 nanometers to 20 nanometers.

13. The structure of claim 1 wherein the first thickness of the first portion of the second polycrystalline layer is within a range of 150 nanometers to 250 nanometers, and the thickness of the first polycrystalline layer is within a range of 10 nanometers to 20 nanometers.

14. The structure of claim 1 wherein the first polycrystalline layer and the second polycrystalline layer each contain polycrystalline semiconductor material, a plurality of defects, and an inert gas species.

15. A method comprising:
performing a first plurality of ion implantation processes to form a first plurality of segments in a substrate, wherein each of the first plurality of segments contains first implanted ions and the first plurality of ion implantation processes are performed at a first plurality of different energies;
performing a second plurality of ion implantation processes to form a second plurality of segments in the substrate, wherein each of the second plurality of segments contains second implanted ions and the second plurality of ion implantation processes are performed at a second plurality of different energies; and
annealing the substrate to transform the substrate proximate to the first plurality of segments and the second plurality of segments into a first polycrystalline layer and a second polycrystalline layer that is positioned between the first polycrystalline layer and top surface of the substrate,
wherein the substrate includes a first portion of single-crystal semiconductor material that is positioned between the second polycrystalline layer and the top surface of the substrate, the substrate includes a second portion of single-crystal semiconductor material that is positioned between the first polycrystalline layer and the second polycrystalline layer, the first polycrystalline layer has a thickness, and the second polycrystalline layer has a first portion with a first thickness that is greater than the thickness of the first polycrystalline layer.

16. The method of claim 15 further comprising:
forming a shallow trench isolation region extending from the top surface into the substrate,
wherein the second polycrystalline layer includes a second portion in direct contact with the shallow trench isolation region, and the first portion of the second polycrystalline layer is located at a greater depth relative to the top surface of the substrate than the shallow trench isolation region.

17. The method of claim 16 wherein the second portion of the second polycrystalline layer has a second thickness that is greater than the first thickness of the first portion of the second polycrystalline layer.

18. The method of claim 16 wherein the second polycrystalline layer includes a third portion laterally between the first portion and the second portion of the second polycrystalline layer and adjacent to the shallow trench isolation region, and the third portion of the second polycrystalline layer has a curved interface with the first portion of single-crystal semiconductor material.

19. The method of claim 15 further comprising:
forming a first shallow trench isolation region and a second trench isolation region extending from the top surface into the substrate,
wherein the first shallow trench isolation region and the second trench isolation region define an active device region of the substrate, the first polycrystalline layer and the second polycrystalline layer each extend beneath the active device region, the first shallow trench isolation region, and the second trench isolation region, and the first portion of the second polycrystalline layer includes a polycrystalline structure that is continuous beneath the active device region.

20. The method of claim 15 wherein the first plurality of ion implantation processes implant at least two different ion species to form the first plurality of segments, and the second plurality of ion implantation processes implant at least two different ion species to form the second plurality of segments.

* * * * *